(12) United States Patent
Moll et al.

(10) Patent No.: US 9,465,749 B2
(45) Date of Patent: Oct. 11, 2016

(54) DMA ENGINE WITH STLB PREFETCH CAPABILITIES AND TETHERED PREFETCHING

(71) Applicant: QUALCOMM TECHNOLOGIES, INC., San Diego, CA (US)

(72) Inventors: Laurent Moll, San Jose, CA (US); Jean-Jacques Lecler, Antibes (FR); Philippe Boucard, Le Chesnay (FR)

(73) Assignee: Qualcomm Technologies, Inc., San Diego, CA (US)

( * ) Notice: Subject to any disclaimer, the term of this patent is extended or adjusted under 35 U.S.C. 154(b) by 380 days.

(21) Appl. No.: 13/969,559

(22) Filed: Aug. 17, 2013

(65) Prior Publication Data

US 2014/0052955 A1    Feb. 20, 2014

Related U.S. Application Data

(60) Provisional application No. 61/684,705, filed on Aug. 18, 2012.

(51) Int. Cl.
*G06F 12/02* (2006.01)
*G06F 12/10* (2016.01)
*G06F 12/08* (2016.01)
*G06F 17/50* (2006.01)

(52) U.S. Cl.
CPC ....... *G06F 12/1036* (2013.01); *G06F 12/0207* (2013.01); *G06F 12/0215* (2013.01); *G06F 12/0811* (2013.01); *G06F 12/1027* (2013.01); *G06F 12/1081* (2013.01); *G06F 17/5009* (2013.01); *G06F 2212/681* (2013.01)

(58) Field of Classification Search
CPC .......... G06F 12/0215; G06F 12/0811; G06F 12/0207; G06F 12/1036
USPC ................... 711/200–205, 134, 137
See application file for complete search history.

(56) References Cited

U.S. PATENT DOCUMENTS

| | | |
|---|---|---|
| 4,525,780 A | 6/1985 | Bratt et al. |
| 4,914,577 A | 4/1990 | Stewart et al. |
| 5,598,553 A | 1/1997 | Richter et al. |

(Continued)

FOREIGN PATENT DOCUMENTS

| | | |
|---|---|---|
| EP | 0495167 A2 | 7/1992 |
| EP | 0518575 A1 | 12/1992 |

(Continued)

OTHER PUBLICATIONS

Altera, "SOPC Builder User Guide", Dec. 2010, chapter 11, pp. 1-25. [retrieved May 14, 2014]. Retrieved from the Internet.

(Continued)

*Primary Examiner* — Yong Choe
(74) *Attorney, Agent, or Firm* — Muncy, Geissler, Olds & Lowe, P.C.

(57) ABSTRACT

A system with a prefetch address generator coupled to a system translation look-aside buffer that comprises a translation cache. Prefetch requests are sent for page address translations for predicted future normal requests. Prefetch requests are filtered to only be issued for address translations that are unlikely to be in the translation cache. Pending prefetch requests are limited to a configurable or programmable number. Such a system is simulated from a hardware description language representation.

13 Claims, 3 Drawing Sheets

(56) References Cited

U.S. PATENT DOCUMENTS

| | | |
|---|---|---|
| 5,694,567 A | 12/1997 | Bourekas et al. |
| 5,701,448 A | 12/1997 | White |
| 5,752,274 A | 5/1998 | Garibay, Jr. et al. |
| 6,065,113 A | 5/2000 | Shiell et al. |
| 6,195,735 B1 | 2/2001 | Krueger et al. |
| 6,212,603 B1 | 4/2001 | McInerney et al. |
| 6,289,138 B1 | 9/2001 | Yip et al. |
| 6,389,514 B1 | 5/2002 | Rokicki |
| 6,560,664 B1 | 5/2003 | Carlson |
| 6,574,698 B1 | 6/2003 | Dhong et al. |
| 6,629,207 B1 | 9/2003 | Yoshioka et al. |
| 6,675,280 B2 | 1/2004 | Cooksey et al. |
| 6,735,688 B1 | 5/2004 | Upton et al. |
| 6,819,326 B2 | 11/2004 | Jaspers |
| 7,099,318 B2 | 8/2006 | Harriman |
| 7,143,225 B1 | 11/2006 | Tischler et al. |
| 7,797,494 B2 | 9/2010 | Kimura |
| 7,962,715 B2 | 6/2011 | Ware |
| 8,095,931 B1 | 1/2012 | Chen et al. |
| 8,185,696 B2 | 5/2012 | Vuletic et al. |
| 8,225,070 B2 | 7/2012 | Okawara et al. |
| 8,250,307 B2 | 8/2012 | Arimilli et al. |
| 8,447,837 B2 | 5/2013 | Devanneaux et al. |
| 2002/0038401 A1 | 3/2002 | Zaidi et al. |
| 2003/0033510 A1 | 2/2003 | Dice |
| 2003/0105940 A1* | 6/2003 | Cooksey ............. G06F 12/0215 711/203 |
| 2003/0126371 A1 | 7/2003 | Venkatraman |
| 2003/0135685 A1 | 7/2003 | Cowan |
| 2004/0034718 A1 | 2/2004 | Goldenberg et al. |
| 2004/0176942 A1 | 9/2004 | Chochia et al. |
| 2004/0215649 A1 | 10/2004 | Whalen et al. |
| 2004/0215849 A1 | 10/2004 | Graham et al. |
| 2004/0260909 A1* | 12/2004 | Lee .................... G06F 12/0862 711/213 |
| 2005/0108497 A1 | 5/2005 | Bridges et al. |
| 2005/0160250 A1 | 7/2005 | Yoshimi |
| 2006/0149981 A1 | 7/2006 | Dieffenderfer et al. |
| 2006/0179175 A1 | 8/2006 | Bockhaus et al. |
| 2006/0184804 A1 | 8/2006 | Varma et al. |
| 2007/0044106 A2 | 2/2007 | Kissell et al. |
| 2007/0067505 A1 | 3/2007 | Kaniyur et al. |
| 2007/0092018 A1 | 4/2007 | Fonseka et al. |
| 2008/0028181 A1 | 1/2008 | Tong et al. |
| 2008/0040584 A1 | 2/2008 | Hansen et al. |
| 2008/0209130 A1* | 8/2008 | Kegel ................. G06F 12/1027 711/135 |
| 2008/0209173 A1 | 8/2008 | Evers et al. |
| 2009/0019252 A1 | 1/2009 | Burns et al. |
| 2009/0164998 A1 | 6/2009 | Stevens et al. |
| 2009/0235278 A1 | 9/2009 | Prakash |
| 2010/0037028 A1 | 2/2010 | Shen et al. |
| 2010/0057997 A1 | 3/2010 | Moyer |
| 2010/0070708 A1* | 3/2010 | Maruyama .......... G06F 12/1027 711/118 |
| 2010/0100682 A1 | 4/2010 | Guthrie et al. |
| 2010/0153686 A1 | 6/2010 | Frank |
| 2010/0223505 A1 | 9/2010 | Andreev et al. |
| 2010/0262787 A1 | 10/2010 | Arimilli et al. |
| 2010/0306503 A1 | 12/2010 | Henry et al. |
| 2010/0318707 A1* | 12/2010 | Tanaka ................. G06F 13/385 710/267 |
| 2011/0010521 A1* | 1/2011 | Wang ................. G06F 12/1027 711/207 |
| 2011/0040941 A1 | 2/2011 | Diefendorff |
| 2011/0072235 A1 | 3/2011 | Deming et al. |
| 2011/0074802 A1 | 3/2011 | Nickolls et al. |
| 2011/0145542 A1 | 6/2011 | Morrow |
| 2011/0219208 A1* | 9/2011 | Asaad ...................... G06F 9/06 712/12 |
| 2012/0011342 A1 | 1/2012 | Ingle et al. |
| 2012/0066455 A1 | 3/2012 | Punyamurtula et al. |
| 2012/0117301 A1 | 5/2012 | Wingard |
| 2012/0124260 A1 | 5/2012 | Kothamasu |
| 2013/0227245 A1* | 8/2013 | Gupta ................. G06F 12/1027 711/205 |
| 2013/0346703 A1* | 12/2013 | McCauley .......... G06F 12/0862 711/137 |
| 2014/0052919 A1 | 2/2014 | Moll et al. |
| 2014/0052954 A1 | 2/2014 | Moll et al. |
| 2014/0052956 A1 | 2/2014 | Moll |

FOREIGN PATENT DOCUMENTS

| | | |
|---|---|---|
| EP | 1031919 B1 | 10/2008 |
| TW | 200951980 A | 12/2009 |
| WO | 2007079192 A2 | 7/2007 |

OTHER PUBLICATIONS

International Search Report and Written Opinion—PCT/US2013/055451—ISA/EPO—May 23, 2014.

* cited by examiner

DMA ENGINE WITH STLB PREFETCH CAPABILITIES AND TETHERED PREFETCHING

CROSS-REFERENCE AND RELATED APPLICATIONS

This application claims priority under 35 USC 119 from U.S. Provisional Application Ser. No. 61/684,705 filed on Aug. 18, 2012, titled SYSTEM TRANSLATION LOOK-ASIDE BUFFER WITH REQUEST-BASED ALLOCATION AND PREFETCHING, the entire disclosure of which is incorporated herein by reference. Furthermore, this application is related to U.S. Non-Provisional patent applications Ser. No. 13/969,425 filed on Aug. 16, 2013 and titled SYSTEM TRANSLATION LOOK-ASIDE BUFFER WITH REQUEST-BASED ALLOCATION AND PREFETCHING, U.S. Non-Provisional patent application Ser. No. 13/969,451 filed on Aug. 16, 2013 and titled SYSTEM TRANSLATION LOOK-ASIDE BUFFER INTEGRATED IN AN INTERCONNECT, and U.S. Non-Provisional patent application Ser. No. 13/969,562 filed on Aug. 17, 2013 and titled STLB PREFETCHING FOR A MULTI-DIMENSION ENGINE, each of which is incorporated herein by reference.

FIELD OF THE INVENTION

The invention disclosed herein is in the field of computer system design, particularly for system-on-chip semiconductor devices.

BACKGROUND

Memory Management Units (MMUs) are commonly used in microprocessors to provide virtual memory capability. When virtual memory is enabled, software executing on the processor only sees and uses Virtual Addresses (VA). The MMU is tasked to convert a VA into a Physical Address (PA) that can then be used inside and outside the processor. Using virtual memory has a number of advantages including being able to give the illusion of more memory than is actually available, giving access to a physical memory system that has more address bits than are supported by the software, and protection of the physical memory with varying access rights.

Some modern systems that support virtualization have two levels of translation between VAs and PAs. The first level is similar to that found on non-virtualized system, but the PA is not the final PA. It may be called Intermediate Physical Address (IPA) or Guest Physical Address (GPA). The second level maps that intermediate address into a final PA. In these systems, for any software running on the processor, the first level or the second level or both may be enabled.

In general, the virtual address space is divided into pages. Pages are commonly a few kilobytes, though other page sizes can be used. Systems often support multiple page sizes from a few kilobytes to a few megabytes or even gigabytes to increase translation efficiency. All addresses within a page are translated in the same fashion and all the access right information is the same. The translation between VAs and PAs is done through a (often multi-level) page table. The process of going through the page table to translate a VA into a PA is often called walking as it comprises a sequence of table lookups.

The MMU often comprises two parts. The first part is called the Translation Look-aside Buffer (TLB). It caches translations so that they are very quickly accessible to the processor, so that for translations that are cached, the processor can execute with little delay. The second part is the walker, which walks the page tables when the TLB does not contain a translation. In some systems, there may be more caching between the TLB and the walker. For instance, the TLB may have 2 levels of caching. The walker may itself contain a cache.

A System MMU (SMMU) mirrors the use of the MMU, but applied to I/O devices instead of microprocessors. With an SMMU, I/O devices can also take advantage of the benefits of virtual memory and virtualization. Like an MMU, an SMMU operates on pages and uses page tables to calculate translations. In some cases, an SMMU may use the same page table formats as the MMU of a processor to which the SMMU's I/O device is connected. In that case, the page tables may be shared between the MMU and the SMMU.

Like an MMU, an SMMU often consists of a walker and a System TLB (STLB), acting as a cache for translations to help in keeping peak performance of I/O device. In some cases, multiple STLBs can share a single walker for efficiency reasons.

In most cases, TLBs inside processors are tightly integrated with the processor because physical addresses are needed inside the processor (e.g. for caches that may be visible to cache coherency). In contrast, an STLB does not have to be integrated inside an I/O device. It may be placed outside the I/O device without any negative impact. In many cases, multiple I/O devices may share a single STLB. An STLB just needs to be between the source and the destination of a request to provide translation services. In designs that have an interconnect, STLBs may be placed between the I/O devices and the interconnect, or in the interconnect, close to the I/O devices.

Some I/O devices, like some microprocessors, perform prefetch operations to cause data to be moved from a backing store into a cache so that a likely future request will hit rather than miss in the cache. Prefetching generally costs backing store bandwidth for the benefit of lower average memory access latency.

In a system with a TLB, any access might cause a miss in the TLB translation table. TLB misses, though less frequent than cache misses in most operating conditions, can cause significantly longer delays than a normal cache miss.

SUMMARY OF THE INVENTION

The herein disclosed invention is an effective system to initiate TLB translation prefetches for I/O devices. This can give a significant reduction in average memory access latency. The invention is embodied in a DMA engine that is connected to a TLB. A DMA engine is any device, exclusive of central processing units, that moves blocks of data from a memory, to a memory, or both. DMA engines can be connected with I/O interfaces, integrated within processing engines, stand-alone, or otherwise incorporated within chips.

Prefetching occurs as a result of requests being sent with particular VAs. Key to the effectiveness of prefetching is the functionality of a prefetch virtual address generator within the DMA engine.

DETAILED DESCRIPTION

Figure 1:
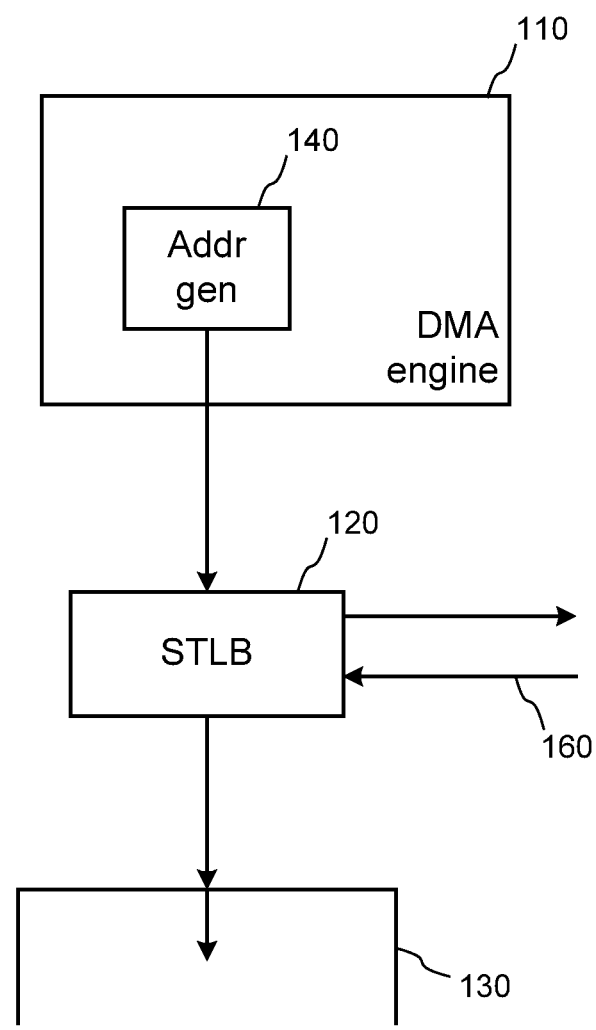
FIG. 1 illustrates a system of a DMA engine with virtual address generator, STLB, and target in accordance with the present invention.

FIG. 1 shows a system comprising DMA engine 110 sending requests to STLB 120 in which the virtual addresses of the requests are translated. Examples of DMA engines include I/O-based engines like Ethernet, wireless, USB, SATA controllers, but also multimedia engines like camera image signal processing engines, video engines, 2D and 3D engines, and accelerators like TCP/IP and cryptography accelerators. DMA engine 110 and STLB 120 are in communication. DMA engine 110 includes virtual address generator 140, which generates sequences of virtual addresses to be sent in requests. According to some aspects of the invention, DMA engine 110 and STLB 120 are directly connected. According to other aspects of the invention DMA engine 110 and STLB 120 are connected through another module. Backing store requests are made to interconnect 130. Alternatively, a target such as a next-level cache or backing store DRAM controller could be in place of interconnect 130.

The STLB 120 caches address translations and can send translation requests for translations not in the cache through walker interface 160. Alternatively, a walker can be integrated with the STLB 120, making it a full SMMU. In such a case, a translation table memory interface would be connected in place of walker interface 160. In such a case, alternatively walker interface 160 might not be present, and page table memory requests would be sent directly to interconnect 130.

STLB 120 adds modest latency to all requests sent by DMA engine 110 as a result of the logic to perform translation look-ups and address modification. However, when a request misses in STLB 120 (i.e. the page translation corresponding to the virtual address is not present in the translation cache), STLB 120 goes through a lengthy process to retrieve the translation from the page table memory. This causes significant delay to requests with TLB misses.

Depending on the ordering constraints of the request stream and the buffering capability of STLB 120, it may be able to handle multiple misses simultaneously. However, when its buffering capabilities are exhausted, STLB 120 has to process misses one at a time, adding even more dramatically to request latency.

Simple block-based DMA engines can have good page locality. For example, for a common page size of 4 KB, a simple block-based DMA engine may place 64 consecutive 64B requests. The first request to the page will miss and delay the sending of the request. However, when the translation has been received by the STLB 120, it can be reused efficiently for the following 63 requests. While the first request incurs a significant latency penalty, the following ones can go through quickly, once the translation has been received, leading to a significant, but usually not crippling overall performance penalty due to the presence of the STLB. The performance penalty depends on the latency of the translation retrieval and the rate of the requests.

However, many DMA engines have request patterns that have a much poorer page locality. For instance, a 2D DMA engine that reads an array vertically can send every requests to a different page than the previous one. If the number of pages accessed is greater than the number of translations that can be stored in the TLB, the misses can seriously cripple performance. If the cache is large enough, when the 2D engine fetches the next column, the pages may still be in the cache, reducing the penalty.

Within microprocessors, the addresses of requests are not easily computed in advance. However, many DMA engines have little dependency between the data fetched and their addresses. Such DMA controllers can easily generate an accurate stream of anticipated requests.

This is naturally used by decoupling the virtual address generator from the data buffer management such that the virtual address generator is limited only when the data management runs out of space or when a number of supported outstanding requests is reached. This property can be used to reduce the performance penalty of STLB misses.

Figure 2:
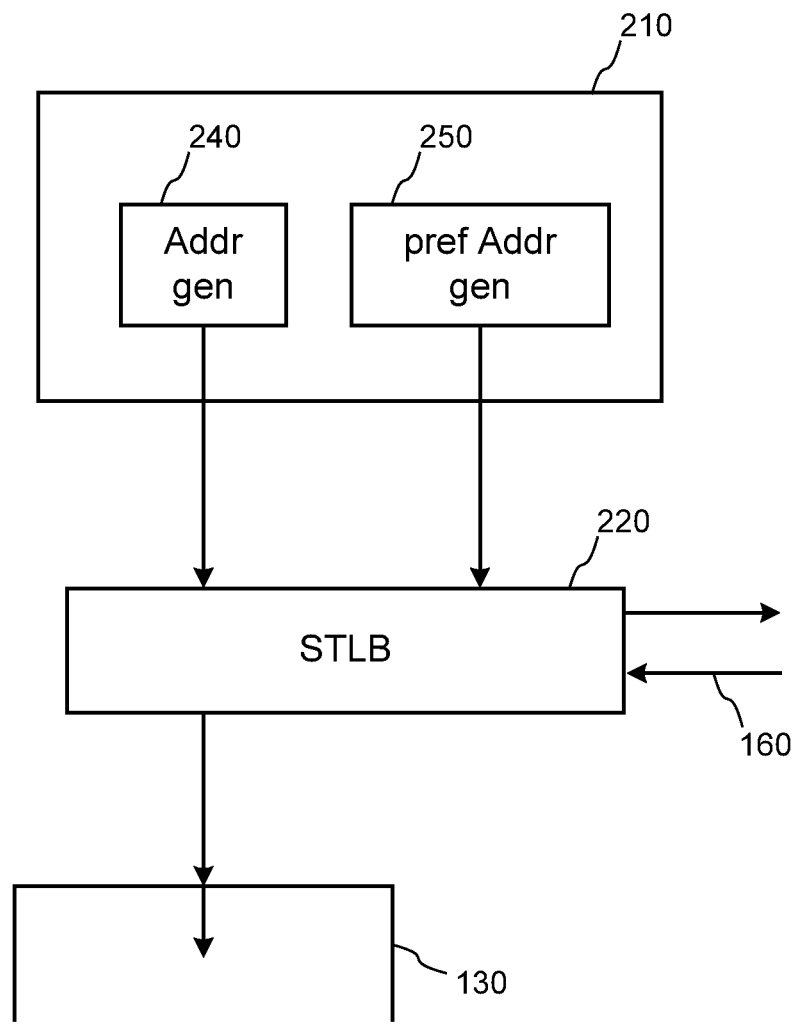
FIG. 2 illustrates a system of a DMA engine with normal and prefetch virtual address generators, STLB, and target in accordance with the present invention.

FIG. 2 shows a system containing DMA engine 210, in communication with or connected to STLB 220, which is in communication with or connected to target 130. DMA engine 210 generates two virtual address streams. One virtual address stream is the normal virtual address stream generated by a normal virtual address generator 240. The other virtual address stream is a stream of prefetch virtual addresses, generated by a prefetch virtual address generator 250, that is similar to, but runs ahead of, the virtual address stream generated by the normal virtual address generator 240.

According to some aspects of the invention, prefetch virtual address generator 250 is identical to normal virtual address generator 240. According to other aspects of the invention, prefetch virtual address generator 250 shares some logic with normal virtual address generator 240. Some types of possible shared logic are configuration registers and portions of state machines.

According to some aspects of this invention, the prefetch virtual address generator 250 sends a prefetch request corresponding to each normal requests that will be sent later by normal virtual address generator 240. According to other aspects of the invention, prefetch virtual address generator 250 avoids requesting prefetches with redundant consecutive virtual addresses that fall within pages that have been accessed in a previous or recent request. One method of doing so is to restrict the derived stream of prefetches to only request addresses that correspond to a particular address within a page. Normally, that would be the first address within a page.

According to some aspects of this invention, the prefetch requests are legally formed according to a standard transaction protocol in use. Some standard transaction protocols are the Advanced Microcontroller Bus Architecture (AMBA) Advanced eXtensible Interface (AXI) and Open Cores Protocol (OCP). According to some aspects of this invention, whereas normal requests are for a full cache line, prefetch requests are for a small data quantity like zero bytes or one byte. A zero byte request is illegal according to some protocols, but might be used as an indication of a prefetch. A one byte request is legal according to most protocols, and can be used as a prefetch size. A one byte request, a byte being a minimum atomic unit of data request, has the benefit of ensuring the requested data will not cross any boundaries between defined address ranges or cadences of access restrictions such as a page size aligned ranges. Furthermore, a one byte request requires exactly one cycle of data transfer on an interface. Alternatively, input requests can be forced to be page aligned, such as by discarding lower address bits.

According to some aspects of this invention, the prefetch requests must contain no data. According to some aspects of this invention, the prefetch request must be aligned to a certain boundary, like 4 KB. According to other aspects of the invention, the prefetch requests take special forms not anticipated by the protocol. According to some aspects of the invention, prefetch request ID must be different from the ID of normal requests.

According to some aspects of the invention, pending prefetch requests must all have different IDs. According to some aspects of the invention, the STLB interface limits the number of pending prefetch requests to a certain number. The number of pending prefetch requests is dynamic, meaning that it can be changed in the manufactured chip, such as by software programming the number or by software selecting from a choice of possible numbers.

According to some aspects of this invention, STLB 220 receives both normal and prefetch request streams from the DMA engine 210. According to some aspects of the invention, normal requests and the prefetch requests are sent on different physical or virtual request channels. According to other aspects of the invention, the normal requests and the prefetch requests are sent on the same channels, and the prefetch requests are identifiable by STLB 220.

Some, though not necessarily all, ways to identifiable by:
using a sideband signal that is sent with each request;
using the ID of the request;
using address bits of the requests;
using other fields or combination of fields are part of a request; and
using a dedicated prefetch port that is separate from the port used for normal requests.

According to some aspects of this invention, prefetch virtual address generator 250 includes control logic to send requests based on the current state of the normal virtual address generator 240, buffer availability within DMA engine 210, or the interaction of prefetch virtual address generator 250 with STLB 220.

According to some aspects of the invention, prefetch virtual address generator 250 is tethered to normal virtual address generator 240 such that it only generates virtual addresses that are within a distance of N virtual addresses ahead of a virtual addresses generated by normal virtual address generator 240. Typically the normal address for calculating this distance is the latest-generated normal address.

According to some aspects of this invention, the tether is based on the filtered prefetch virtual address stream (i.e. where a prefetch virtual address is not generated if a request meets a certain criterion such as the request having an address in the same page as another recent request) such that the prefetch virtual address stream only generates virtual addresses that are M filtered virtual addresses ahead of the normal stream. This is useful to control the number of new pages requested by the prefetch stream, so as to avoid thrashing the TLB cache with too much prefetching. According to some aspects of the invention, N and M may be hard coded, dynamically programmable, or part of a table of possible value.

According to some aspects of the invention, STLB 220 supports allocation policies in its cache and structures. By limiting the tether N or M to make sure that allocated resources available in STLB 220 are not exceeded, DMA engine 210 guarantees that the prefetch request stream takes advantage of available resources and does not disrupt the behavior of the caches or the request stream.

According to some aspects of the invention, STLB 220 uses responses to prefetch requests as a way to indicate that a cache miss has occurred and a slot has been taken in a tracking structure in the STLB 220. In particular, if a prefetch request is received to a virtual address that is already in the translation cache or already pending as a miss, STLB 220 returns a response immediately. If a prefetch request misses and a walker request for the page is not already pending, STLB 220 returns a response only when the translation is returned by the walker. According to some aspects of the invention, the prefetch virtual address generator 250 can be programmed to only have P prefetch requests pending. In conjunction with STLB 220, which returns responses to misses only after a translation has been obtained, prefetch virtual address generator 250 ensures that it does not send more requests to STLB 220 than it can handle. That avoids either backpressure from STLB 220, or dropping of prefetch requests by STLB 220, neither being desirable. According to some aspects of the invention, P may be hard coded, programmable dynamically, or part of a table of possible value.

According to some aspects of the invention, STLB 220 also supports an allocation policy. Some allocation policies applicable to STLB prefetches are described in U.S. Non-Provisional patent application Ser. No. 13/969,425 filed on Aug. 16, 2013 and titled SYSTEM TRANSLATION LOOK-ASIDE BUFFER WITH REQUEST-BASED ALLOCATION AND PREFETCHING and U.S. Provisional Application Ser. No. 61/684,705 filed on Aug. 18, 2012 and titled SYSTEM TRANSLATION LOOK-ASIDE BUFFER WITH REQUEST-BASED ALLOCATION AND PREFETCHING. Using the allocation policy, DMA engine 210 can reserve a specific number of entries in STLB 220. By limiting its number of outstanding prefetches to that number, DMA engine 210 ensures that it never causes prefetch overflows in STLB 220.

According to some aspects of the invention, STLB 220 supports selectable or programmable allocation policies. Prefetch requests from DMA engine 210 include an indication of which allocation policy STLB 220 should use.

According to some aspects of the invention, DMA engine 210 contains multiple normal virtual address generators. A prefetch virtual address generator is coupled to a number of normal virtual address generators to enable them to take advantage of STLB prefetching.

A TLB, like any cache, has an eviction policy. The eviction policy determines which stored translation to replace when a new translation is fetched from the walker. Prefetches may be used to bias this eviction policy. According to an aspect of the invention, the TLB uses a least recently used (LRU) replacement policy, and a prefetch has the effect of "using" the entry translation, thereby lowering the probability of its eviction.

Figure 3:
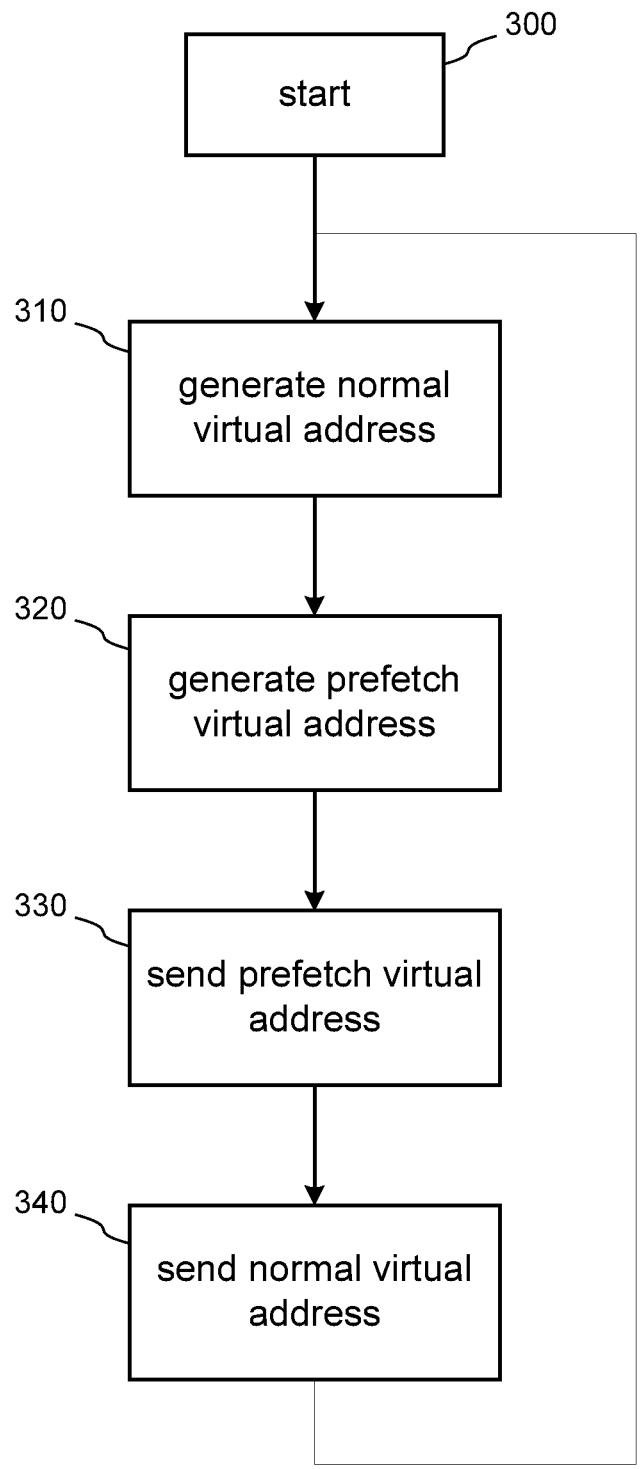
FIG. 3 illustrates the process of creating a prefetch virtual address stream and a normal virtual address stream in accordance with the present invention.

Referring now to the flowchart of FIG. 3 and according to an aspect of the invention, the prefetch request stream is tethered. The prefetch request stream is identical to the normal request stream, but in advance. The process of generating virtual address streams starts at step 300. At step 310, DMA engine generates a normal virtual address. Next, and based on normal virtual address generated at step 310, the DMA engine generates prefetch virtual address at step 320. The prefetch virtual address is sent to the STLB at step 330, either directly or via an intermediate module. Some amount of time thereafter, the time ideally being at least as long as it takes an STLB to fetch a translation, the DMA sends the normal virtual address to the STLB at step 340, either directly or via an intermediate module.

A "use counter" is associated with each translation entry. The "use counter" is incremented for each prefetch request, and decremented for each normal request. A non-null use counter prevents the entry from being evicted. A prefetch request that misses requires an eviction. If that eviction is prevented, the prefetch request is stalled. This mechanism automatically adjusts the length of the tether, as a function of the number of entries available in the STLB and the locality of the request flow.

As will be apparent to those of skill in the art upon reading this disclosure, each of the aspects described and illustrated herein has discrete components and features which may be readily separated from or combined with the features and aspects to form embodiments, without departing from the scope or spirit of the present invention. Any recited method can be carried out in the order of events recited or in any other order which is logically possible.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or system in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein.

In accordance with the teaching of the present invention a computer and a computing device are articles of manufacture. Other examples of an article of manufacture include: an electronic component residing on a mother board, a server, a mainframe computer, or other special purpose computer each having one or more processors (e.g., a Central Processing Unit, a Graphical Processing Unit, or a microprocessor) that is configured to execute a computer readable program code (e.g., an algorithm, hardware, firmware, and/or software) to receive data, transmit data, store data, or perform methods.

The article of manufacture (e.g., computer or computing device) includes a non-transitory computer readable medium or storage that includes a series of instructions, such as computer readable program steps or code encoded therein. In certain aspects of the present invention, the non-transitory computer readable medium includes one or more data repositories. Thus, in certain embodiments that are in accordance with any aspect of the present invention, computer readable program code (or code) is encoded in a non-transitory computer readable medium of the computing device. The processor, in turn, executes the computer readable program code to create or amend an existing computer-aided design using a tool. In other aspects of the embodiments, the creation or amendment of the computer-aided design is implemented as a web-based software application in which portions of the data related to the computer-aided design or the tool or the computer readable program code are received or transmitted to a computing device of a host.

An article of manufacture or system, in accordance with various aspects of the present invention, is implemented in a variety of ways: with one or more distinct processors or microprocessors, volatile and/or non-volatile memory and peripherals or peripheral controllers; with an integrated microcontroller, which has a processor, local volatile and non-volatile memory, peripherals and input/output pins; discrete logic which implements a fixed version of the article of manufacture or system; and programmable logic which implements a version of the article of manufacture or system which can be reprogrammed either through a local or remote interface. Such logic could implement either a control system either in logic or via a set of commands executed by a soft-processor.

Accordingly, the preceding merely illustrates the various aspects and principles of the present invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the various aspects discussed and described herein. Rather, the scope and spirit of present invention is embodied by the appended claims.

What is claimed is:

1. A Direct Memory Access (DMA) engine enabled to send a prefetch request including a prefetch virtual address and a normal request including a normal virtual address to a System Translation Look-Aside Buffer (STLB), the DMA engine comprising:
   an address generator; and
   an STLB interface enabled to send the prefetch request;
   wherein the address generator generates the prefetch virtual address to be within a distance of an N number of virtual addresses ahead of the normal virtual address, wherein N is a number greater than zero.

2. The DMA engine of claim 1 wherein the address generator generates the prefetch virtual address for the prefetch request and the normal virtual address for the normal request.

3. The DMA engine of claim 1 comprising a second address generator, wherein the address generator generates the prefetch virtual address for the prefetch request and the second address generator generates the normal virtual address for the normal request.

4. The DMA engine of claim 3 further comprising a second STLB interface enabled to send the normal request.

5. The DMA engine of claim 1 wherein the prefetch request comprises an indication of an allocation policy.

6. The DMA engine of claim 1 further enabled to receive a prefetch response wherein the prefetch response indicates whether a cache miss has occurred.

7. The DMA engine of claim 1 wherein the STLB interface limits a number of pending prefetch requests.

8. The DMA engine of claim 7 wherein the number of pending prefetch requests is dynamic.

9. A non-transitory computer readable medium including hardware description language code, wherein the non-transitory readable medium and the hardware description language code are configured to simulate:
   a Direct Memory Access (DMA) engine enabled to send a prefetch request including a prefetch virtual address and a normal request including a normal virtual address to a System Translation Look-Aside Buffer (STLB); and
   the STLB in communication with the DMA engine, wherein the DMA engine sends a normal address sequence to the STLB and the DMA engine sends a prefetch address sequence to the STLB;
   wherein the prefetch virtual address is within a distance of an N number of virtual addresses ahead of the normal virtual address, wherein N is a number greater than zero.

10. A method of generating prefetch requests for a System Translation Look-Aside Buffer (STLB) within a Direct Memory Access (DMA) engine, the method comprising:
    generating a stream of normal virtual addresses; and
    generating a stream of prefetch virtual addresses that correspond to the normal virtual addresses;
    wherein the stream of prefetch virtual addresses are within a distance of an N number of virtual addresses ahead of the stream of normal virtual addresses, wherein N is a number greater than zero.

11. The method of claim 10 wherein the prefetch virtual addresses are not aligned to a particular address within a page.

12. The method of claim 11 wherein the particular address is a first address of the page.

13. The method of claim 10 wherein the stream of prefetch virtual addresses is blocked when a number of pending prefetch requests exceeds a maximum number of pending prefetch requests.

* * * * *